United States Patent
Li et al.

(10) Patent No.: US 9,544,862 B2
(45) Date of Patent: Jan. 10, 2017

(54) METHOD AND DEVICE FOR PERFORMING AUTOMATIC GAIN CONTROL

(71) Applicant: Telefonaktiebolaget L M Ericsson (publ), Stockolm (SE)

(72) Inventors: Ming Li, Beijing (CN); Xuejun Sun, Beijing (CN)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/898,615

(22) PCT Filed: Jun. 21, 2013

(86) PCT No.: PCT/CN2013/077658
§ 371 (c)(1),
(2) Date: Dec. 15, 2015

(87) PCT Pub. No.: WO2014/201688
PCT Pub. Date: Dec. 24, 2014

(65) Prior Publication Data
US 2016/0119886 A1    Apr. 28, 2016

(51) Int. Cl.
*H04B 1/16*    (2006.01)
*H04W 52/52*    (2009.01)
(Continued)

(52) U.S. Cl.
CPC ........... *H04W 52/52* (2013.01); *H03G 3/3036* (2013.01); *H03G 3/3073* (2013.01);
(Continued)

(58) Field of Classification Search
CPC ............ H04B 10/2931; H04B 10/2942; H04B 7/15535; H03G 3/00; H03G 3/301; H03G 3/3026
(Continued)

(56) References Cited

U.S. PATENT DOCUMENTS 3,781,882 A * 12/1973 Holberg ................ G01S 13/524
                                                                342/162
6,563,891 B1 * 5/2003 Eriksson .............. H03G 3/3078
                                                                375/345

(Continued)

FOREIGN PATENT DOCUMENTS

CN    102932301 A    2/2013
CN    103024889 A    4/2013

OTHER PUBLICATIONS

International Preliminary Report on Patentability for International Patent Application No. PCT/CN2013/077658, mailed Dec. 30, 2015, 6 pages.

(Continued)

*Primary Examiner* — Siu Lee
(74) *Attorney, Agent, or Firm* — Withrow + Terranova, PLLC

(57) ABSTRACT

The present invention relates to a method and device for performing automatic gain control. The method comprises predicting an AGC setting to be used based on statistical data with respect to a plurality of previously stored AGC settings. The method also comprises receiving an interference signal during an idle time period using the predicted AGC setting. The method further comprises detecting received power of the interference signal. The method additionally comprises adjusting the predicted AGC setting based on a result of the detecting. With the method and device of the present invention, an initial AGC setting with high accuracy and usability can be obtained and the glitch effect can be overcome.

8 Claims, 13 Drawing Sheets

(51) Int. Cl.
 *H03G 3/30* (2006.01)
 *H04L 5/14* (2006.01)
(52) U.S. Cl.
 CPC ............. *H03G 3/3078* (2013.01); *H04B 1/16*
 (2013.01); *H04L 5/14* (2013.01)
(58) Field of Classification Search
 USPC ........ 375/345, 316; 455/130, 132, 136, 138,
 455/232.1, 239.1, 240.1, 241.1, 245.1,
 4552/50.1, 251.1
 See application file for complete search history.

(56) References Cited

U.S. PATENT DOCUMENTS

| | | | | |
|---|---|---|---|---|
| 8,144,634 | B2* | 3/2012 | Nejatian | H04W 52/52 370/280 |
| 2002/0187765 | A1* | 12/2002 | Kozak | H03M 1/185 455/232.1 |
| 2003/0026363 | A1* | 2/2003 | Stoter | H03G 3/3052 375/345 |
| 2004/0022334 | A1* | 2/2004 | Roosli | H04B 10/114 375/345 |
| 2006/0148436 | A1 | 7/2006 | Kim | |
| 2008/0090538 | A1* | 4/2008 | Ishiguro | H03G 1/0088 455/249.1 |
| 2009/0060102 | A1 | 3/2009 | Wong et al. | |
| 2013/0012149 | A1* | 1/2013 | Ben Ghalba | H03G 3/3078 455/226.1 |

OTHER PUBLICATIONS

Jang, Jun Hee, et al., "A Fast Automatic Gain Control Scheme for 3GPP LTE TDD System," IEEE 72nd Vehicular Technology Conference Fall (VTC 2010-Fall), Sep. 6-9, 2010, Ottawa, Canada, IEEE, 5 pages.

International Search Report and Written Opinion for International Patent Application No. PCT/CN2013/077658, mailed Mar. 27, 2014, 9 pages.

\* cited by examiner

METHOD AND DEVICE FOR PERFORMING AUTOMATIC GAIN CONTROL

This application is a 35 U.S.C. §371 national phase filing of International Application No. PCT/CN2013/077658, filed Jun. 21, 2013, the disclosure of which is incorporated herein by reference in its entirety.

TECHNICAL FIELD

Example embodiments of the present invention generally relate to a wireless communication technology, and more particularly, relate to a method and a device for performing automatic gain control (AGC) in a wireless communication system.

BACKGROUND

Receivers for wireless communications, which may be incorporated into a base station (BS) or a user equipment (UE), and the like and operate in accordance with multiple standards, are generally equipped with an AGC function, as depicted in FIGS. 1 and 2, which respectively illustrate schematic block diagrams of an analogy part 10 and a digital part 20 of a receiver for performing AGC.

The processing chain of the analogy part 10, among other things, includes a radio frequency (RF) filter, a controllable attenuator, an intermediate frequency (IF) filter, a variable gain amplifier (VGA), an IF mixer, an anti-aliasing (AA) filter, and an analog to digital converter (ADC). Upon completion of the processing of the analogy part 10 of the receiver, the received signal would come into the processing of the digital part 20 of the receiver. As illustrated, having been subjected to the processing of the analog part 10, the resulting digital signal enters into the digital part 20, in which in addition to the conventional processing including a fast fourier transform (FFT) decoding, and $E_b/I_0$ reading, the power level of the received signal would be measured by a power meter and then compared with a number of predefined thresholds. Then the receiver would apply the AGC setting resulting from the digital part 20 to the analogy part 10, as illustrated in FIG. 1 by a dashed line, based on the result of the comparison of the measured power level with the predefined thresholds.

The AGC is advantageously used to ensure that the signal received by the receiver should be processed at a suitable signal level (e.g., suitable signal power) by correspondingly adjusting the gain of the receiver in response to varying input signal levels. For example, the AGC scales the received signal such that the signal can be represented by a limited number of bits for digital processing without significant loss of information. The receiver gain determined by the AGC should be large enough to minimize quantization noise. In the meantime, the AGC should ensure that the power of the scaled signal does not exceed a maximum range of the digital processing, i.e., the digital part 20 does not get saturated.

FIG. 3 is a schematic illustration of active periods and deactivate periods of the above-discussed AGC in a time division duplex (TDD) frame. As seen from FIG. 3, during the time interval including time periods of a subframe #2 and a subframe #3, which are scheduled to transmit on the uplink (UL), the AGC keeps active. In other words, during the reception period in which a BS plays a role as a receiving party, the AGC retains active mode unchanged. In contrast, during the time interval including time periods of a subframe #4 and a subframe #5, which are scheduled to transmit on the downlink (DL), and a special subframe, which includes a DwPTS part, a guard period (GP) part, and an UpPTS part, the AGC keeps deactivated. That is, the AGC retains deactivate mode unchanged during the transmission period of the BS.

Simply put, in the UL subframes, the AGC function is continuously active based on the instantly detected received power level while in the DL subframe and special subframe, the AGC function is deactivated and determines a constant receiver gain setting so as to keep the receiver gain unchanged or maximize achievable attenuation.

In the UL subframe, when the received power level reaches one of multiple predefined thresholds, such as those illustrated in FIG. 2, the AGC would be trigged and thus the gain setting of the receiver would be updated. In other words, different received power levels may trigger multiple AGC states when comparing with the predefined threshold. Due to different states, the receiver gain would be correspondingly set to a different gain setting.

In view of the foregoing discussions made with respect to FIGS. 1-3, it can be understood that the current AGC is a complete passive protection method for received high power level interference and is only triggered by incoming high power level interference, resulting in some drawbacks as discussed below.

First, the AGC reaction needs extra reaction time to update the gain setting in the receiver and this reaction time may occupy the normal receiving time periods, thereby adversely impacting the normal receiving operations.

Second, the rapid changes in the signal level and phase will generate spurious effects (also known as "glitch") during transitions through different gain/attenuation paths in the receiver when the AGC changes the receiver gain setting, which is shown in FIG. 4, which is a schematic illustration of glitches upon AGC gain changes (decrement or incensement) or receiver gain setting changes. During the glitch period, as depicted by "$t_{glitch\_dur}$," the normal receiving operations cannot be properly performed and the processing in the baseband will be affected in a negative way. The glitch suppression method implemented in the common signal processing is to simply insert zero data instead of the samples affected by the glitch. Generally, the AGC needs extra time to re-stabilize the receiver gain after the interference signal injects into the receiver. Lots of glitches spread in time can cause receiver efficiency to decrease rapidly and impact throughput seriously. In worst case, wireless communications could be temporarily interrupted or may even break down.

For instance, in a TDD communication system in which the UL subframes are not continuous, the proportion of wasted UL time period resources is higher than what is in the FDD system due to the glitch and consequently the glitch impact to system performance becomes more critical in complex application scenarios.

In particular, in the TDD system, all possible UL/DL subframe configurations are exemplarily shown in table 1.

TABLE 1

| UL-DL configuration | DL to UL switch point period | Subframe number | | | | | | | | | |
|---|---|---|---|---|---|---|---|---|---|---|---|
| | | 0 | 1 | 2 | 3 | 4 | 5 | 6 | 7 | 8 | 9 |
| 0 | 5 ms | D | S | U | U | U | D | S | U | U | U |
| 1 | 5 ms | D | S | U | U | D | D | S | U | U | D |
| 2 | 5 ms | D | S | U | D | D | D | S | U | D | D |
| 3 | 10 ms | D | S | U | U | U | D | D | D | D | D |

TABLE 1-continued

| UL-DL configuration | DL to UL switch point period | \multicolumn{10}{c}{Subframe number} |
|---|---|---|---|---|---|---|---|---|---|---|---|
| | | 0 | 1 | 2 | 3 | 4 | 5 | 6 | 7 | 8 | 9 |
| 4 | 10 ms | D | S | U | U | D | D | D | D | D | D |
| 5 | 10 ms | D | S | U | D | D | D | D | D | D | D |
| 6 | 5 ms | D | S | U | U | U | D | S | U | U | D |

It can be considered that configuration 5 is the worst case from an AGC point of view because it merely has one UL subframe (i.e., subframe 2). In all else subframe time intervals of 9 ms (1 ms per subframe), instant interferences are complex and changeable. Due to this, the AGC setting in the last UL subframe almost cannot be a correct reference for AGC setting in the next UL subframe. At the same time, due to lack of UL resource for AGC detection, correct recovery of normal receiving takes rather longer time. In the TDD mode, it takes time duration of more than one orthogonal frequency division multiplexing (OFDM) symbol for AGC gain convergence, which results in a significant glitch effect.

There are proposed some existing solutions for addressing some drawbacks in the AGC. For example, in the paper entitled "A Fast Automatic Gain Control Scheme for 3GPP LTE TDD System" in Vehicular Technology Conference Fall (VTC 2010-Fall), 2010 IEEE 72nd, a fast AGC circuit is proposed, wherein an average signal amplitude ratio of the received sample signal is applied after the ADC to trigger the AGC, in order to avoid large signal power variation. The problem with this solution is that the average signal amplitude ratio could bring about a risk of instant burst interference, which cannot be detected by the AGC function and it needs a total new digital architecture, which is not a common and easy design. Further, in the U.S. Pat. No. 8,144,634B2, entitled "reducing automatic gain control process in time division duplex communication mode," the noise level detected in the DwPTS or GP part of a special subframe is proved to be used as input of the AGC setting in the next UL subframe. The problem associated with this patent is that an additional hardware circuit is needed for detection of the noise level so as to build a new AGC feature and extra ADC and digital resources are requisite for processing the detected noise signal. It would be more challenged to achieve high accuracy of noise detection circuit with low cost and the noise detection circuit with high accuracy would incur more undesirable hardware cost and consume more potential resources.

SUMMARY

It is an objective of the present invention to at least alleviate some of the above disadvantages and provide an improved method and device for AGC control.

According to an aspect of the present invention, there is provided a method for performing AGC in a receiver in a wireless communication system. The method comprises predicting an AGC setting to be used based on statistical data with respect to a plurality of previously stored AGC settings. The method also comprises receiving an interference signal during an idle time period using the predicted AGC setting. The method further comprises detecting received power of the interference signal. The method additionally comprises adjusting the predicted AGC settings based on a result of the detecting.

According to another aspect of the present invention, there is provided a device for performing AGC in a wireless communication system. The device comprises a predicting module configured to predict an AGC setting to be used based on statistical data with respect to a plurality of previously stored AGC settings. The device also comprises a receiving module configured to receive an interference signal during an idle time period using the predicted AGC setting. The device further comprises a detecting module configured to detect received power of the interference signal. The device additionally comprises an adjusting module configured to adjust the predicted AGC setting based on a result of the detecting.

According to the above aspects of the present invention, it is an advantage that additional hardware cost could be reduced or avoided since there is no or less impact on the current available AGC function and common hardware system structures of the receiver.

Because the predicted AGC setting is further adjusted and used as an initial AGC setting at the beginning of the normal AGC function, it is an advantage that occurrence possibility of the glitch in the TDD receiver is significantly decreased, especially in the situation where the TDD receiver has more AGC trigged possibility than the FDD receiver. According to the embodiments of the present invention, because the AGC setting is obtained based on the statistical data with respect to a plurality of previously stored AGC settings and can be adjusted based on the received power of the interference signal, it is another advantage that an initial AGC setting with high accuracy and usability can be obtained, thereby significantly improving signal reception under various interference scenarios, including those more general interference scenarios. Additionally, the adjustment of the AGC setting is applicable to any of periodic interference or instant interference, which makes the AGC more robust and flexible.

The discussion above and below in respect of any of the aspects of the invention is also in applicable parts relevant to any other aspect of the present invention.

Generally, all terms used in the claims are to be interpreted according to their ordinary meaning in the technical field, unless explicitly defined otherwise herein. All references to "a/an/the element, device, component, means, step, etc." are to be interpreted openly as referring to at least one instance of the element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which:

FIG. 17 is a schematic illustration of an AGC prediction under the interference scenario as illustrated in FIG. 16a.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

The communication terminal may be any suitable wireless communication terminal or UE, such as a mobile phone or a portable computer. Below, reference is often made to a UE. However, this should not limit the present invention to any specific communication standard. Rather, the terms UE and communication terminal may be regarded as essentially synonymous, unless conflicting with the context. Likewise, the BS may be any suitable radio BS, according to any suitable communication standard, such as a Node B or an eNode B.

Figure 5:
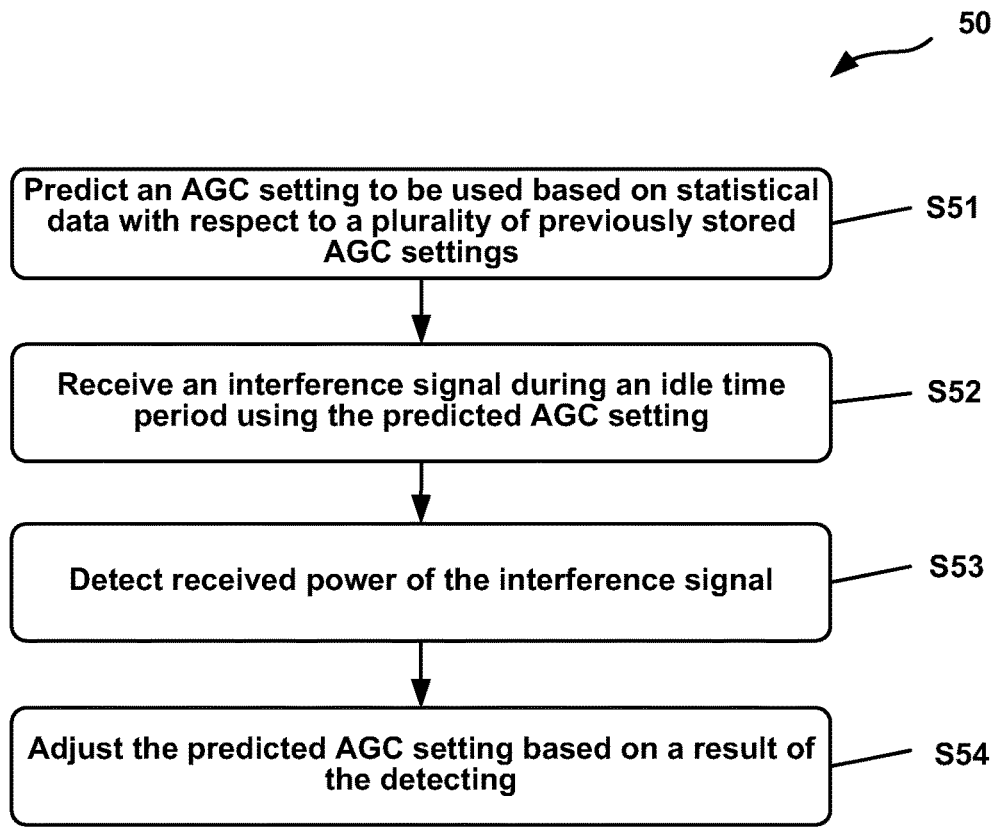
FIG. 5 is a schematic flow chart of an embodiment of a method of the present invention.
Figure 10:
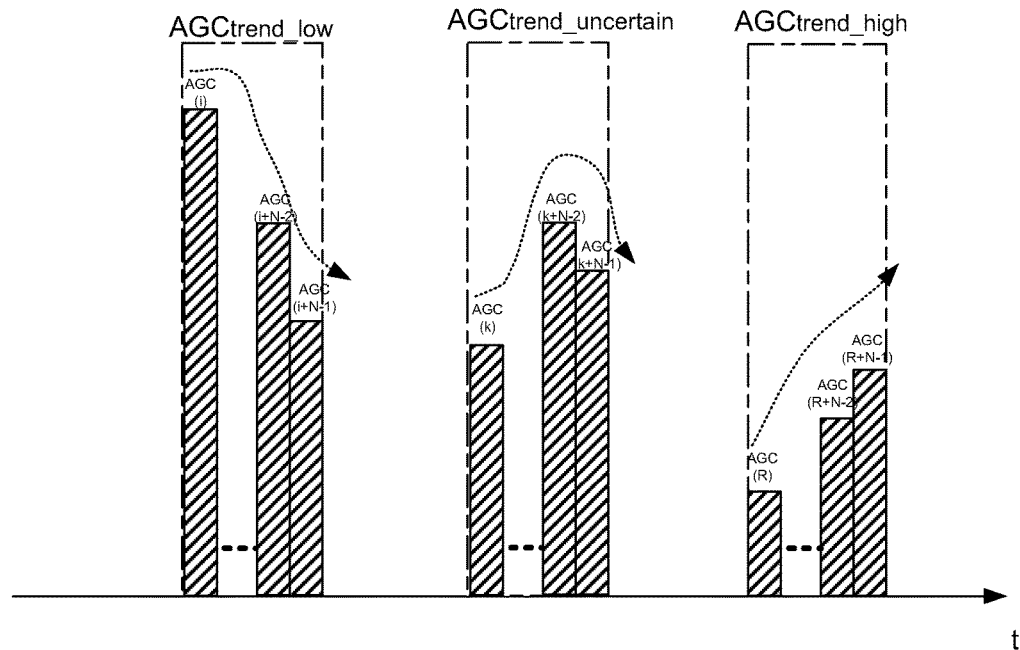
FIG. 10 is a schematic illustration of prediction of an AGC setting based on a trend approach according to another embodiment of the present invention.

With reference to FIG. 5 which is a schematic flow chart of an embodiment of a method 50 of the present invention, at step S51, the method 50 predicts an AGC setting to be used based on statistical data with respect to a plurality of previously stored AGC settings. The plurality of previously stored AGC settings could be N number of previously stored AGC settings as shown in FIG. 10 by bar charts. In an embodiment, the statistical data with respect to the plurality of previously stored AGC settings is used to determine one of a trend and an average value of the plurality of previously stored AGC settings and the AGC setting is predicted based on the trend or the average value.

According to an embodiment of the present invention, the trend could be an increasing trend, a decreasing trend or an uncertain trend, e.g., respectively shown as "AGCtrend_high," "AGCtrend_low," and "AGCtrend_uncertain" in FIG. 10. Further, based on one of the increasing trend, the decreasing trend or the uncertain trend, the method 50 may additionally increase, decrease or retain unchanged an AGC setting used immediately before the predicting based on the increasing trend, the decreasing trend or the uncertain trend, respectively. For example, if the trend is the increasing trend, the method 50 would increase the currently used AGC setting, i.e., the latest AGC setting such that the resulting AGC setting to be used next time is relatively more feasible and usable for the subsequent incoming signal, which is an interference signal and reaches the receiver during an idle time period according to embodiments of the present invention.

According to another embodiment of the present invention, the method 50 may predict the AGC setting based on a result of comparing the average value as mentioned above with at least two predefined thresholds, one of the at least two predefined threshold being an upper limit threshold and another one of the at least two predefined thresholds being a lower limit threshold. For example, based on the previously-used AGC settings ranging from AGC(i) to AGC(i+N−1) (N is a predefined time), the statistic data of N number of AGC settings is collected.

According to these statistic data, the average value AGCavg,i at issue is calculated through the following equation:

$$AGCavg, i = \frac{AGC(i) + AGC(i+1) + \ldots + AGC(i+N-1)}{N}. \quad (1)$$

Then, the method 50 may determine whether the average value is higher than the upper limit threshold, whether the average value is lower than the lower limit threshold, or whether the average value falls between the upper limit threshold and the lower limit threshold. Similar to the embodiment discussed with respect to the trend, the method 50 may increase, decrease or retain unchanged an AGC setting used immediately before the predicting based on the average value being higher than the upper limit threshold, the average value being lower than the lower limit threshold or the average value falling between the upper limit threshold and the lower limit threshold, respectively.

Returning back to FIG. 5, upon completion of prediction of the AGC setting to be used, at step S52, the method 50 receives an interference signal during an idle time period using the predicted AGC setting. According to an embodiment of the present invention, the interference signal may be a periodic interference signal or an instant interference signal. According to another embodiment of the present invention, the idle time period is a GP in a special subframe since the GP is an available time period in all UL-DL configurations. In addition to this, the idle time period may also be an idle subframe which has no DL or UL traffic.

Subsequent to receipt of the interference signal, the method 50 detects received power of the interference signal at step S53. According to an embodiment of the present invention, in the GP, the power received by the receiver after the T/R switch is switched to the receiving mode includes the power with respect to noise plus interference, which are collectively referred to as the interference signal since both may interfere with the normal reception. The detected power level may be the summation of thermal noise at the input of the receiver, noise figure of the receiver and noise caused by interference, as illustrated at the right hand of FIG. 6 and as will be discussed later.

Then, at step S54, the method 50 adjusts the predicted AGC setting based on a result of the detecting performed at step S53. In an embodiment of the present invention, the method 50 may adjust the predicted AGC setting based on a result of comparing the received power of the interference signal with at least two predefined thresholds, wherein one of the at least two predefined threshold is an upper limit threshold and another one of the at least two predefined thresholds is a lower limit threshold. Further, the method 50 may increase, decrease or retain unchanged the predicted AGC setting based on the received power being higher than the upper limit threshold, the received power being lower than the lower limit threshold, or the received power falling between the upper limit threshold and the lower limit threshold, respectively.

Based on the adjusting operation as performed at step S54, the accuracy of the predicted AGC setting can be boosted and therefore the adjusted AGC setting becomes more suitable for using as an initial AGC setting for the subframe reception.

The method 50 can be carried out by a UE or BS which includes a receiver for AGC. According to an embodiment of the present invention, the receiver is a TDD receiver.

Based on the foregoing discussions with respect to the method 50 and its multiple extensions according to the embodiments of the present invention, it can be understood that, as compared to the passive AGC solution in the prior art, the present invention proposes a simplified proactive AGC solution for the TDD receiver compatible with common AGC functions without any hardware change.

Further, with the proposed proactive AGC solution, interference injected into the receiver is detected in the existing receiver architecture with dynamic AGC settings before the subframe reception starts. By means of the statistical data with respect to the previously stored AGC settings, dynamic AGC prediction strategy implementation is adaptable to complex variant site scenarios with variant interferences, such as instant or periodic interferences.

Figure 6:
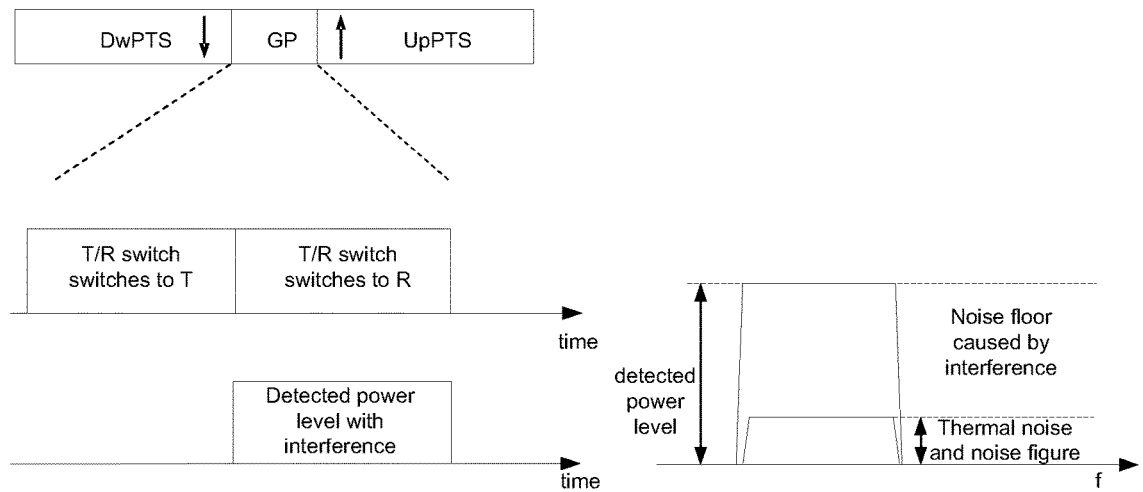
FIG. 6 is a schematic diagram illustrating a time sequence of transmission/reception switch and detection of an interference signal (at the left hand side), and constituents of a detected power level of the interference signal (at the right hand side).

FIG. 6 is a schematic diagram illustrating a time sequence of transmission/reception switch and detection of an interference signal (at the left hand side), and constituents of a detected power level of the interference signal (at the right hand side). As illustrated in FIG. 6, according to an embodiment of the present invention, detection of the received power of the interference signal occurs in the GP part between the DwPTS and the UpPTS parts within a special subframe. Therefore, during the GP, the Transmitter (T)/Receiver(R) switch switches to a receiving mode from a transmitting mode in the time period of the DwPTS. Once the receiving mode is enabled, the receiver would receive the interference signal and thus apply power detection thereon during the same GP, as illustrated at the left hand side of the FIG. 6 with two blocks parallel to each other in time. At the right hand side of the FIG. 6 and as noted before, in the GP during which the receiving mode is enabled, the power level detected by the receiver could be the power level of noise and interference, which are collectively referred to as the interference signal. Hence, the receiver baseband detected power level is usually the summation of the thermal noise at the input of the receiver, the noise figure of the receiver and the noise caused by the interference.

Figure 7:
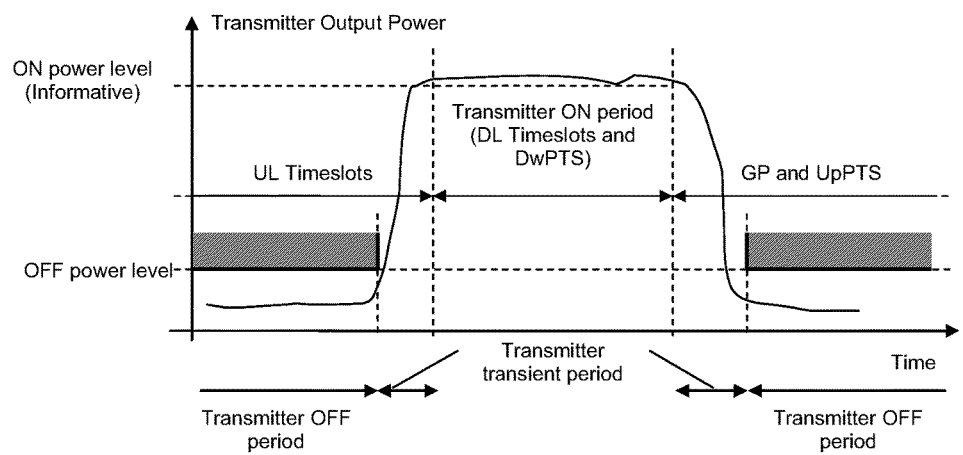
FIG. 7 is a schematic illustration of relations of a transmitter ON period, a transmitter OFF period, and a transmitter transient period according to an embodiment of the present invention.

FIG. 7 is a schematic illustration of relations of a transmitter ON period, a transmitter OFF period, and a transmitter transient period according to an embodiment of the present invention, assuming the BS (or eNode B) as a receiving party. As illustrated in the coordinate graph of the FIG. 7, the horizontal axis represents the time span and the vertical axis represents the transmitter output power. It can be seen that during the transmitter OFF period, the transmitter output power is at an OFF power level, which is typically less than −95 dBm/MHz so as to avoid degradation of co-located receivers. It can be seen that the OFF power level is much lower than the ON power level during the transmitter ON period as shown in the middle part of the coordinate graph. In between the transmitter OFF period and the transmitter ON period is a short transmitter transient period which normally has a time duration of 17 μs. Due to the low OFF power level in the GP as shown in the right side of the coordinate graph, the detected power level in the GP according to embodiments of the present invention may not be affected by the transmitter.

Figure 8:
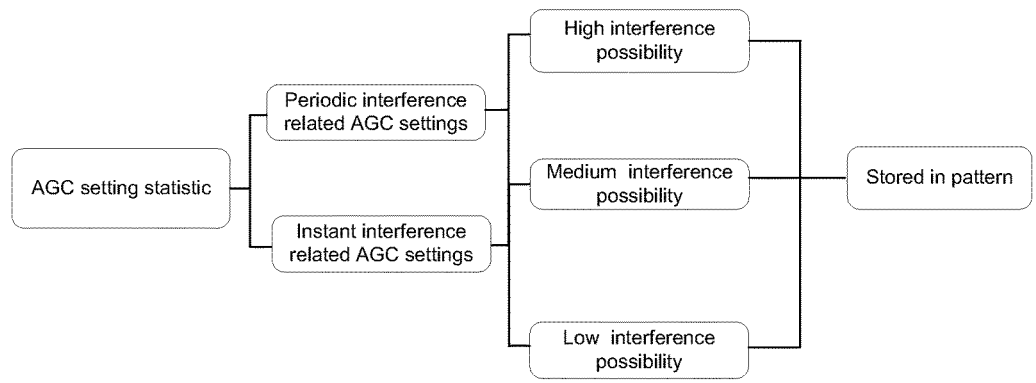
FIG. 8 is a schematic illustration of processing of AGC statistical data according to an embodiment of the present invention.

FIG. 8 is a schematic illustration of processing of AGC statistical data according to an embodiment of the present invention. As illustrated in FIG. 8, the AGC statistical data with respect to a plurality of previous AGC settings according to an embodiment of the present invention can be divided into periodic interference related AGC settings and instant interference related AGC settings based on the characteristics of the interference signals. Both the periodic interference related AGC settings and the instant interference related AGC settings can be determined as having a high interference possibility, a medium interference possibility or a low interference possibility based on any suitable statistical algorithms including, as non-limiting examples, the average-value statistical algorithm and the trend statistical algorithm, as will be discussed in detail in connection with FIGS. 9 and 10.

Figure 9:
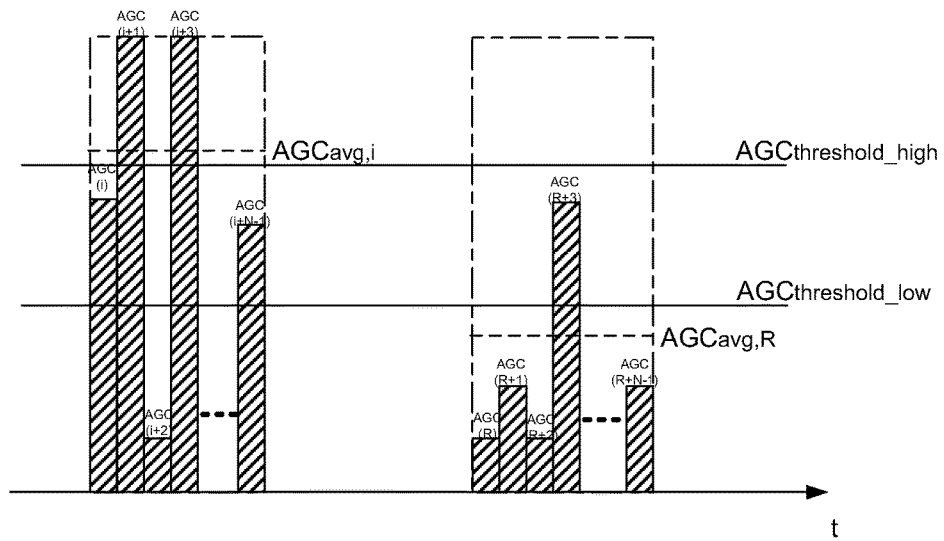
FIG. 9 is a schematic illustration of prediction of an AGC setting based on an average value approach according to an embodiment of the present invention.

First, with reference to FIG. 9 regarding the average-value statistical algorithm, upon collection of N number of AGC settings ranging from AGC(i) to AGC(i+N−1) (N is predefined times), statistical data relating to the previous N AGC settings is formed. Based on this statistical data, the average value of N AGC settings, denoted as "AGCavg,i" can be calculated through the equation (1) as mentioned before. After that, the calculated AGCavg,i may be compared with a predefined AGCthreshold_high (i.e., the upper limit threshold as mentioned before) and if the AGCavg,i is higher than the AGCthreshold_high, it can be considered that there would be a high interference possibility in immediately subsequent subframe reception. Similarly, the calculated AGCavg,i may be compared with a predefined AGCthreshold_low (i.e., the lower limit threshold as mentioned before), and if the calculated AGCavg,i is lower than the AGCthreshold_low, it can be considered that there would be a low interference possibility in the immediately subsequent subframe reception. Likewise, if the AGCavg,i falls between the AGCthreshold_low and AGCthreshold_high, it can be considered that there would be a medium interference possibility.

In this manner, at least one pattern based on one of the high interference possibility, medium interference possibility, and low interference possibility can be stored in bit in order for prediction of the next AGC setting to be used. For instance, as seen from the left hand side of FIG. 9, the calculated average value AGCavg,i is higher than the AGCthreshold_high, then it is determined that the previous N AGC settings form a pattern of having a high interference possibility such that the N+1$_{th}$ AGC setting to be used (or more accurately, to be predicted at this stage) needs to be increased relative to the used N$_{th}$ AGC setting (i.e., AGC (i+N−1) as shown) before the adjusting operation as performed in the method 50. Likewise, at the right hand side of FIG. 9, the calculated average value AGCavg,R is lower than the AGCthreshold_low, then it is determined that the previous N AGC settings form a pattern of having a low interference possibility such that the N+1$_{th}$ AGC setting to be used needs to be decreased relative to the N$_{th}$ AGC setting (i.e., AGC (R+N−1) as shown).

It should be understood that only two predefined thresholds are used herein for an illustrative purpose. A person skilled in the art can appreciate that more than two predefined thresholds can be applied in the above average-value algorithm so as to obtain desirable pattern division accuracy.

Second, with reference to FIG. 10 regarding the trend statistical algorithm, upon collection of N number of AGC settings, statistical data relating to these AGC settings is formed. From the statistical data, it is determined that these AGC settings may have one of the following trends, i.e., a decreasing trend, an uncertain trend, and an increasing trend, which are respectively denoted as "AGCtrend_low," "AGCtrend_uncertain," and "AGCtrend_high," and respectively shown at the left, middle, and right part of FIG. 10.

In particular, as illustrated in FIG. 10, based on the statistical data, if AGC(i)> . . . >AGC(i+N−2)>AGC(i+N−1), as illustrated at the left hand side of FIG. 10, it results in the trend of AGC settings decreasing to lower settings. Then, it can be considered that there is a low interference possibility among these N AGC settings. Further, if AGC(R)< . . . <AGC(R+N−2)<AGC(R+N−1), as illustrated at the right hand side of FIG. 10, it results in the trend of AGC settings increasing to higher settings. Then, it can be considered that there is a high interference possibility among these N AGC settings. In addition, if either AGC(i)> . . . >AGC(i+N−2)>AGC(i+N−1) or AGC(R)< . . . <AGC(R+N−2)<AGC(R+N−1) cannot be guaranteed, for example AGC(k)<AGC(k+N−2)>AGC(k+N−1), it results in the trend of AGC settings being uncertain. It can be considered that there is a medium interference possibility among these N AGC settings. Upon determination of the trend of the statistical data, the pattern can be determined accordingly in the same manner as the average value statistical algorithm.

It should be noted that the pattern as determined above is associated with practical site traffic situation and quality and is real-time changeable or predefined with lookup tables.

Figure 1:
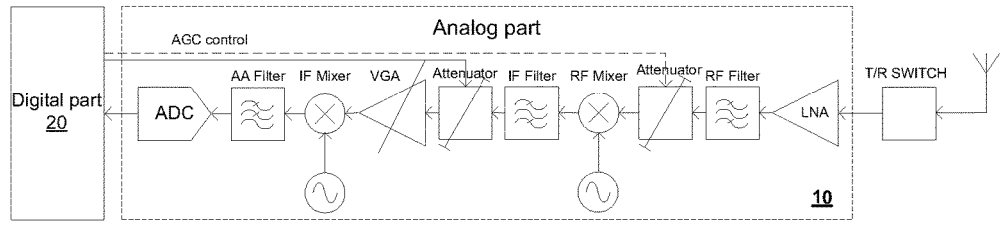
FIG. 1 illustrates a schematic block diagram of a prior art receiver for performing AGC in which some details of an analog part of the receiver is depicted.
Figure 2:
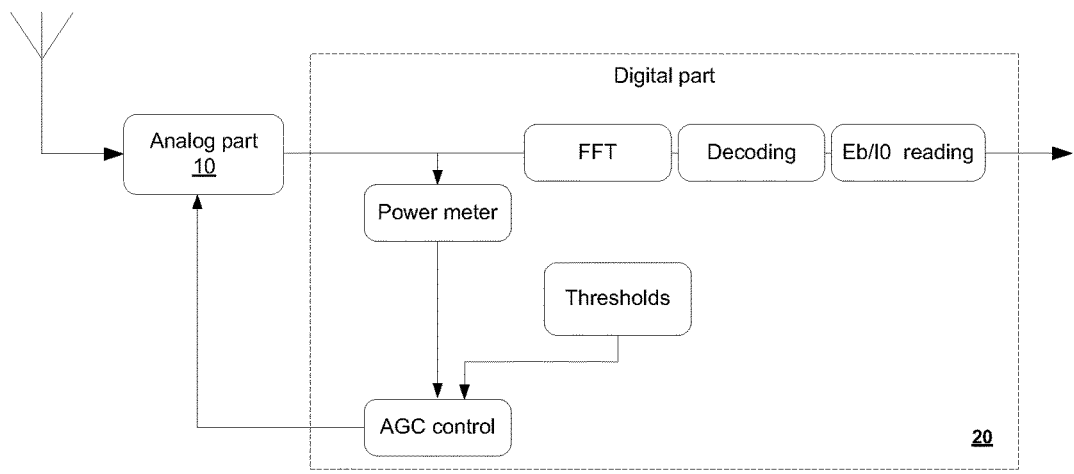
FIG. 2 illustrates a schematic block diagram of some details of a digital part of the receiver as illustrated in FIG. 1.
Figure 3:
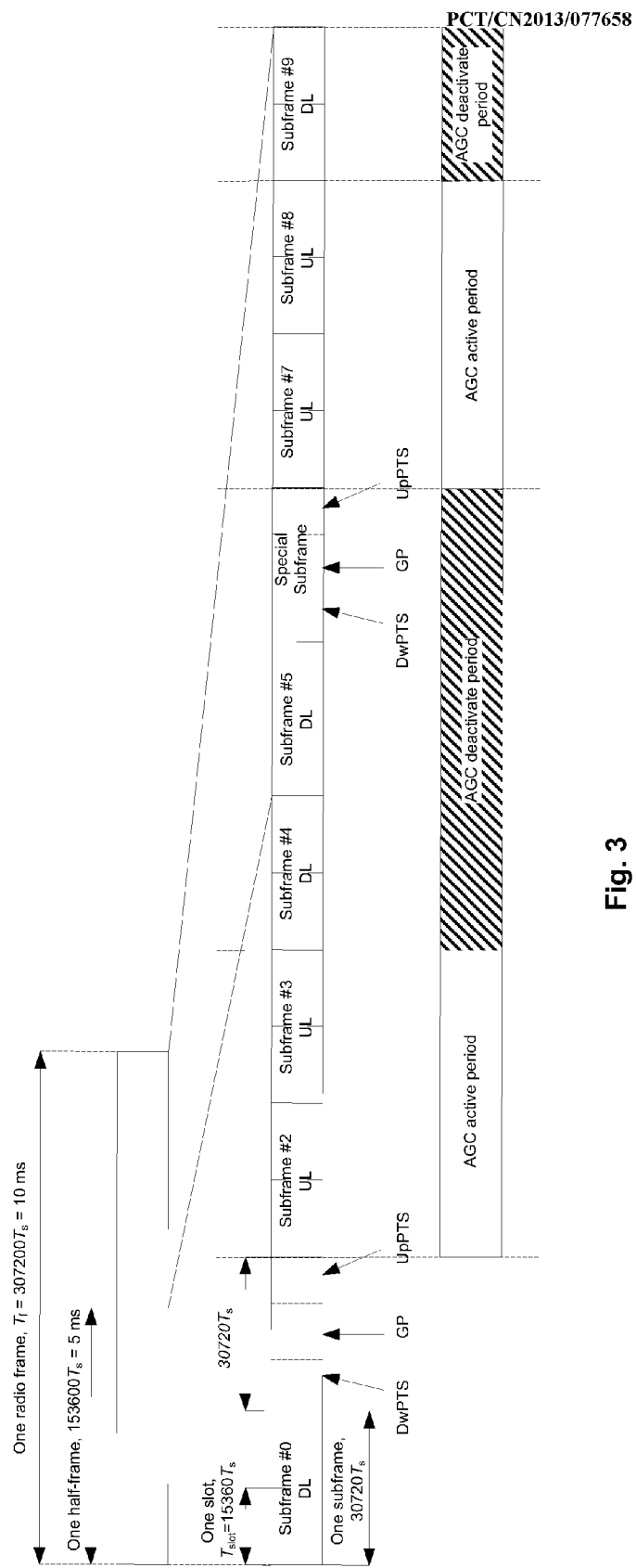
FIG. 3 is a schematic illustration of AGC active periods and AGC deactivate periods in a TDD frame.
Figure 4:
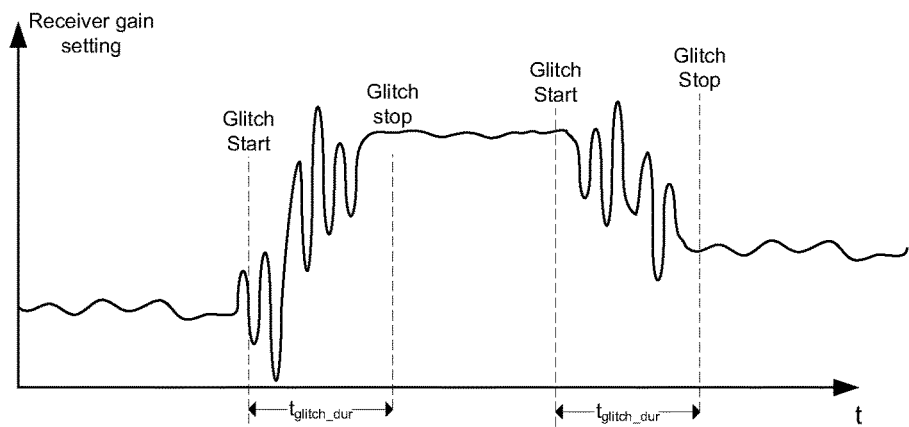
FIG. 4 is a schematic illustration of glitches after AGC gain decrement and incensement.
Figure 11:
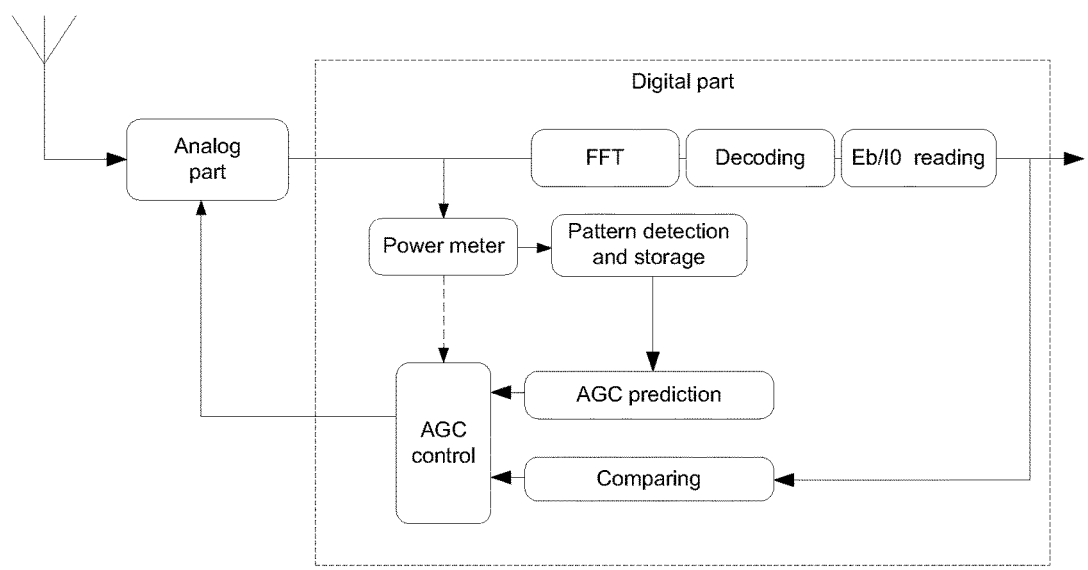
FIG. 11 is a schematic block diagram illustrating a receiver for performing AGC according to an embodiment of the present invention.

FIG. 11 is a schematic block diagram illustrating a receiver for performing AGC according to an embodiment of the present invention. As compared to the prior art receiver as discussed with reference to FIG. 2, the receiver according to embodiments of the present invention may further include a pattern determination and storage block, an AGC prediction block and a comparing block. In the conventional AGC processing that occurs in the receiving mode, the power meter may measure the power of the incoming signal from the analog part and the AGC control block will control the AGC setting based on the measured power and therefore the new AGC setting may be applied to the analog part. However, according to embodiments of the present invention, during the idle time period including but not limited to the GP, the pattern determination and storage block may process the measured signal from the power meter such that the pattern of the previously continuous multiple AGC settings can be determined and stored, as is the case with the operations discussed in connection with FIGS. 8-10. Based on the determined pattern, the AGC setting to be used could be predicted by the AGC prediction block. Once the GP is prepared or synchronized, the comparing block will compare the detected received power of the interference signal with at least two thresholds and the AGC control block may further adjust the predicted AGC setting based on the result of the comparing. The adjusted AGC setting would be used as an initial AGC setting for reception of the incoming signal. According to an embodiment of the present invention, the received power of the interference signal may be determined using $E_b/I_0$ from the $E_b/I_0$ reading block.

Regarding comparison of the received power level with the predefined threshold, the comparing block is to compare the received power level with the predefined thresholds. Based on the current receiver gain setting, AGC prediction conducted in the GP has one chance to update the AGC setting. There are three possibilities with respect to the comparing.

First, the received power level is higher than the upper limit threshold. Then, the comparing block will control the AGC control block (or AGC function circuit) to increase receiver attenuation, i.e., increasing the predicted AGC setting.

Second, the received power level is lower than the lower limit threshold. Then, the comparing block will control the AGC control block to decrease receiver attenuation, i.e., decreasing the predicted AGC setting. For instance, the received power level based on the receiver gain lower than the lower limit threshold cannot be detected once it is lower than noise floor which can be detected.

Third, the received power level falls between the upper and lower limit thresholds. If this is the case, the comparing block will perform no action to the AGC block, i.e., the predicted AGC setting is retained unchanged.

It should be understood that the blocks as shown in FIG. 11 are only illustrative and each block may be divided into multiple sub-blocks. Further, some blocks may be combined in any suitable manner so as to achieve flexible implementations. Further, it should be noted that the blocks as shown in FIG. 11 is merely one example of a potential and specific architecture of the receiver for AGC according to the embodiments of the present invention and should not be used to limit the scope of the present invention. There could be other form of the structural block diagram which may show the receiver in a more general manner according to the embodiments of the present invention, such as one shown in FIG. 18.

Figure 12:
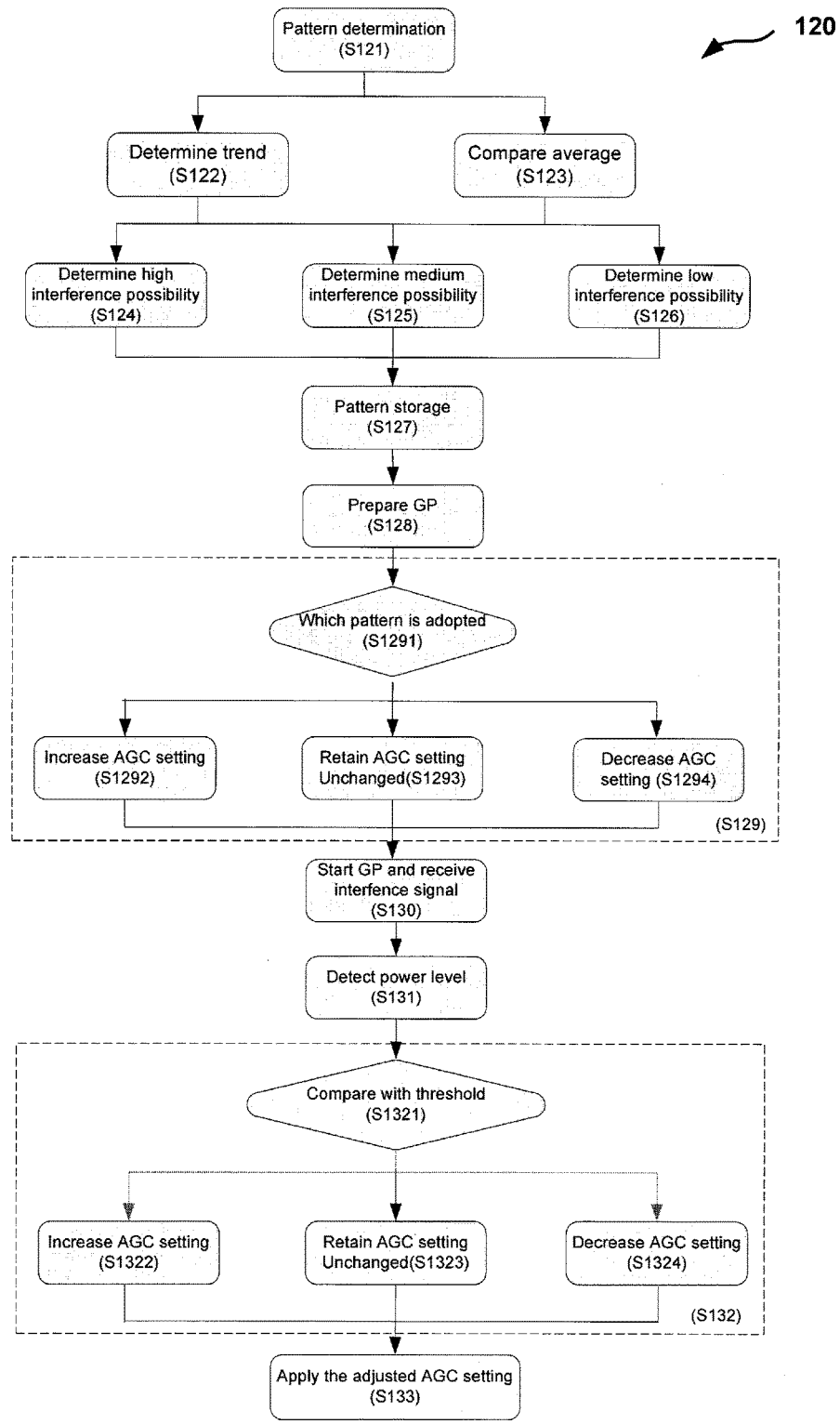
FIG. 12 is a schematic flow chart of another embodiment of a method of the present invention.

FIG. 12 is a schematic flow chart of another embodiment of a method 120 of the present invention. As illustrated in FIG. 12, at step S121, the method 120 initiates pattern determination as discussed in detail with reference to FIGS. 8-10 and at step S127, stores the determined patterns. According to embodiments of the present invention, the pattern determination can be based on the trend statistical algorithm or the average-value statistical algorithm. Thus, the method 120 may proceed to step S122, at which the trend of a plurality of previously stored AGC settings is determined. Otherwise, the method 120 may proceed to step S123, at which the average value of the plurality of previously stored AGC settings is determined and compared with the predefined thresholds.

No matter whether the trend statistical algorithm or the average-value statistical algorithm is applied, the method 120 will determine the pattern of the plurality of previously stored AGC settings based on whether these AGC settings bring about a high interference possibility (at step S124), a medium interference possibility (at step S125) or a low interference possibility (at step S126). Upon determination of the pattern, at step S127, the method 120 stores the pattern e.g., in a form of one or more bits. After that, the method 120 predicts the AGC setting to be used at step S129, which includes substeps S1291-S1294 and is between step S128 at which the GP is prepared and step S130 at which the GP starts and interference signal is received.

At step S1291, the method 120 determines which one of the patterns is adopted. If the pattern having the high interference possibility is adopted, then the method 120 advances to step S1292, at which the method 120 increases the AGC setting used immediately before the predicting. If the pattern having the medium interference possibility is adopted, then the method 120 proceeds to step S1293, at which the method 120 retains unchanged the AGC setting used immediately before the predicting. Additionally, if the pattern having the low interference possibility is adopted, then the method 120 proceeds to step S1294, at which the method 120 decreases the AGC setting used immediately before the predicting. In this manner, the resulting AGC setting can be considered as the predicted AGC setting which would be used for receiving the interference signal in the GP at step S130.

Upon receipt of the interference signal, the method 120 detects at step S131 the received power of the interference signal which consists of noise and interference. After that, the method advances to step S132 which includes substeps S1321-S1324 and at which the predicted AGC setting will be further adjusted. At step S1321, the method 120 compares the detected power level with two predefined thresholds, as those discussed with reference to FIG. 11.

Based on the result of the compare at S1321, the method 120 may proceed to step S1322, at which the method 120 increases the predicted AGC setting if the detected power level is higher than the predefined upper limit threshold. Also, the method 120 may proceed to step S1323, at which the method 120 retains unchanged the predicted AGC setting if the detected power level falls between the predefined upper and lower limit thresholds. Additionally, the method 120 may proceed to step S1324, at which the method 120 decreases the predicted AGC setting if the detected power level is lower than the predefined lower limit threshold. Upon adjustment of the predicted AGC setting via step S132, the method 120 applies at step S133 the adjusted AGC setting as an initial AGC setting for receiving the subframe, such as one immediately following the special subframe.

Figure 13:
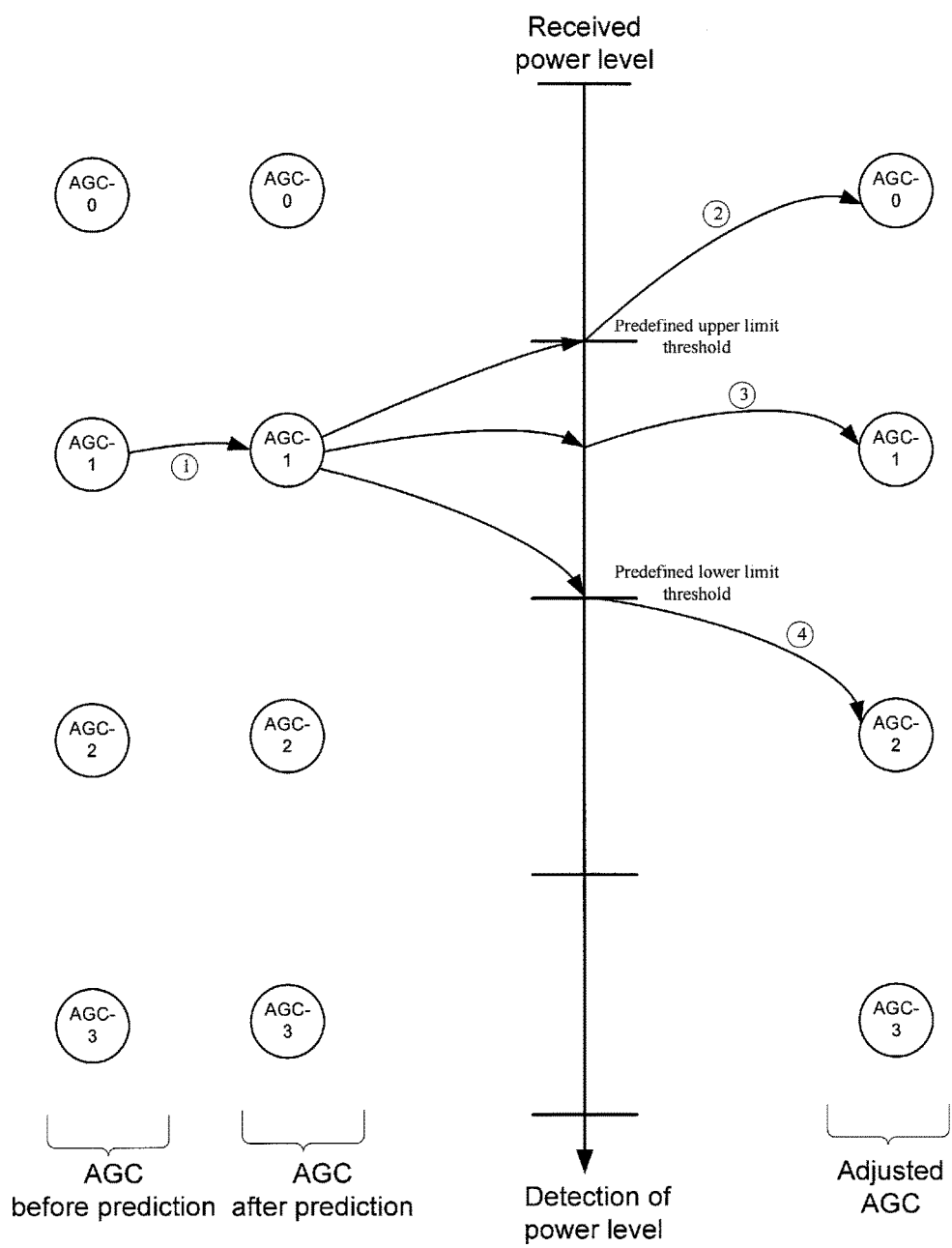
FIG. 13 is a schematic illustration of AGC setting transitions under the pattern of the medium interference possibility according to an embodiment of the present invention.

FIG. 13 is a schematic illustration of AGC setting transitions under the pattern of the medium interference possibility according to an embodiment of the present invention. As illustrated in FIG. 13, before the prediction of the AGC setting to be used, it is assumed that the receiver has an AGC setting of AGC-1. Due to the pattern of the medium interference possibility, the AGC-1 will retain unchanged upon prediction, as denoted by an arrow 1. After the prediction and when the GP starts, the receiver will detect the received power level and compares it with the at least two thresholds, such as the predefined upper limit threshold and the predefined lower limit threshold as discussed before with reference to FIG. 11. Based on the result of the comparing, there are three possibilities for AGC setting transitions. If the detected power level is higher than the predefined upper limit threshold, then the predicted AGC-1 will be adjusted to AGC-0 so as to decrease the receiver gain, as denoted by an arrow 2. If the detected power level is lower than the predefined lower limit threshold, then the predicted AGC-1 will be adjusted to AGC-2 so as to increase the receiver gain, as denoted by an arrow 4. Additionally, if the detected power level falls between the predefined upper limit threshold and the predefined lower limit threshold, then the predicted AGC-1 will retain unchanged so as to keep the receiver gain unchanged.

Figure 14:
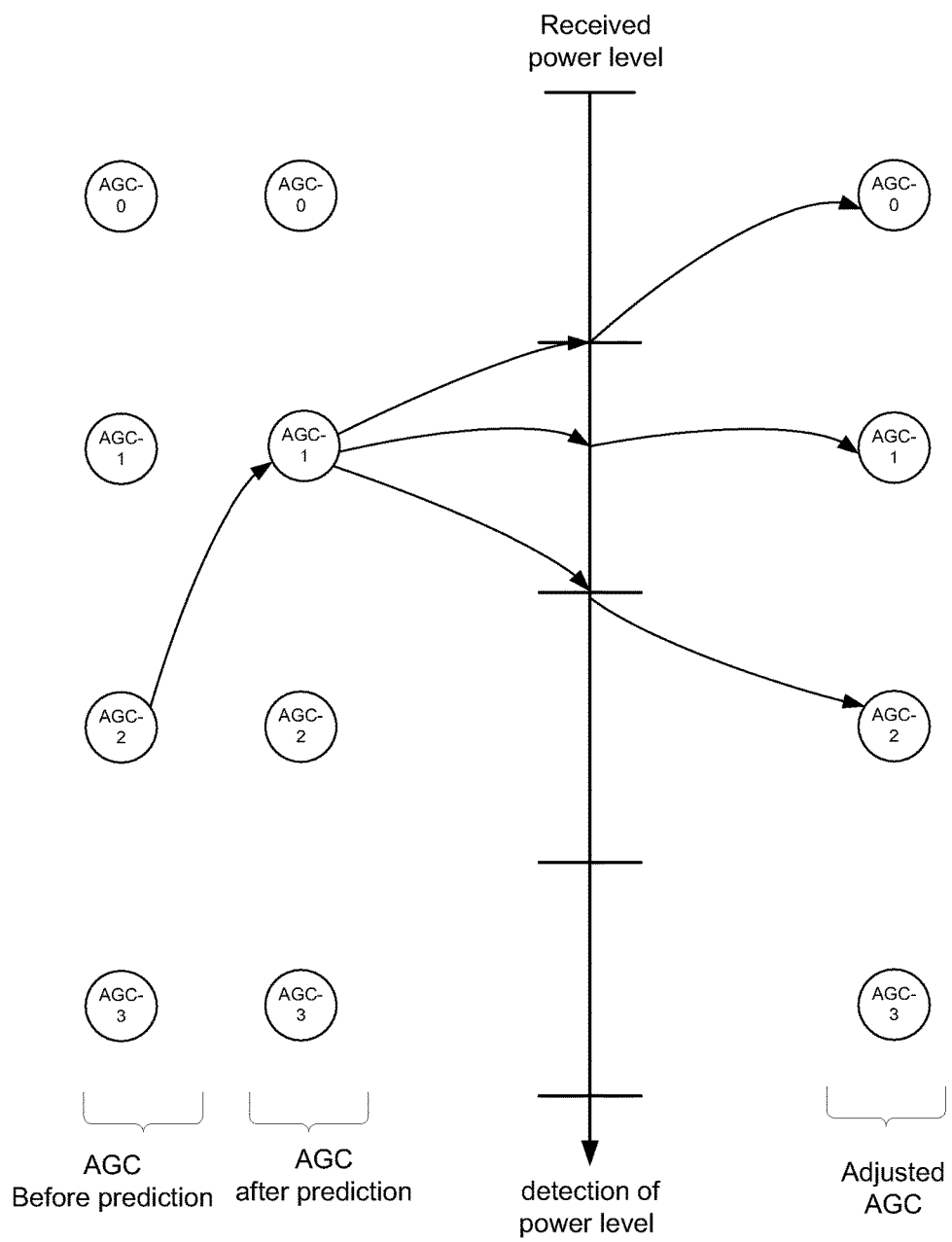
FIG. 14 is a schematic illustration of AGC setting transitions under the pattern of the low interference possibility according to an embodiment of the present invention.

FIG. 14 is a schematic illustration of AGC setting transitions under the pattern of the low interference possibility according to an embodiment of the present invention. As illustrated in FIG. 14, before the prediction of the AGC setting to be used, it is assumed that the receiver has an AGC setting of AGC-2, which could be as a result of being decreased one step manually. Due to the pattern of the lower interference possibility, it is predicted that the AGC-2 should be decreased to AGC-1 so as to enhance the receiver gain. After the prediction, similar to those discussed with reference to FIG. 13, based on the comparing of the detected power level with the predefined upper limit threshold and the predefined low limit threshold, the predicted AGC-1 may be adjusted to AGC-0 due to low interference, adjusted to AGC-1 due to medium interference, and adjusted to AGC-2 due to high interference.

Figure 15:
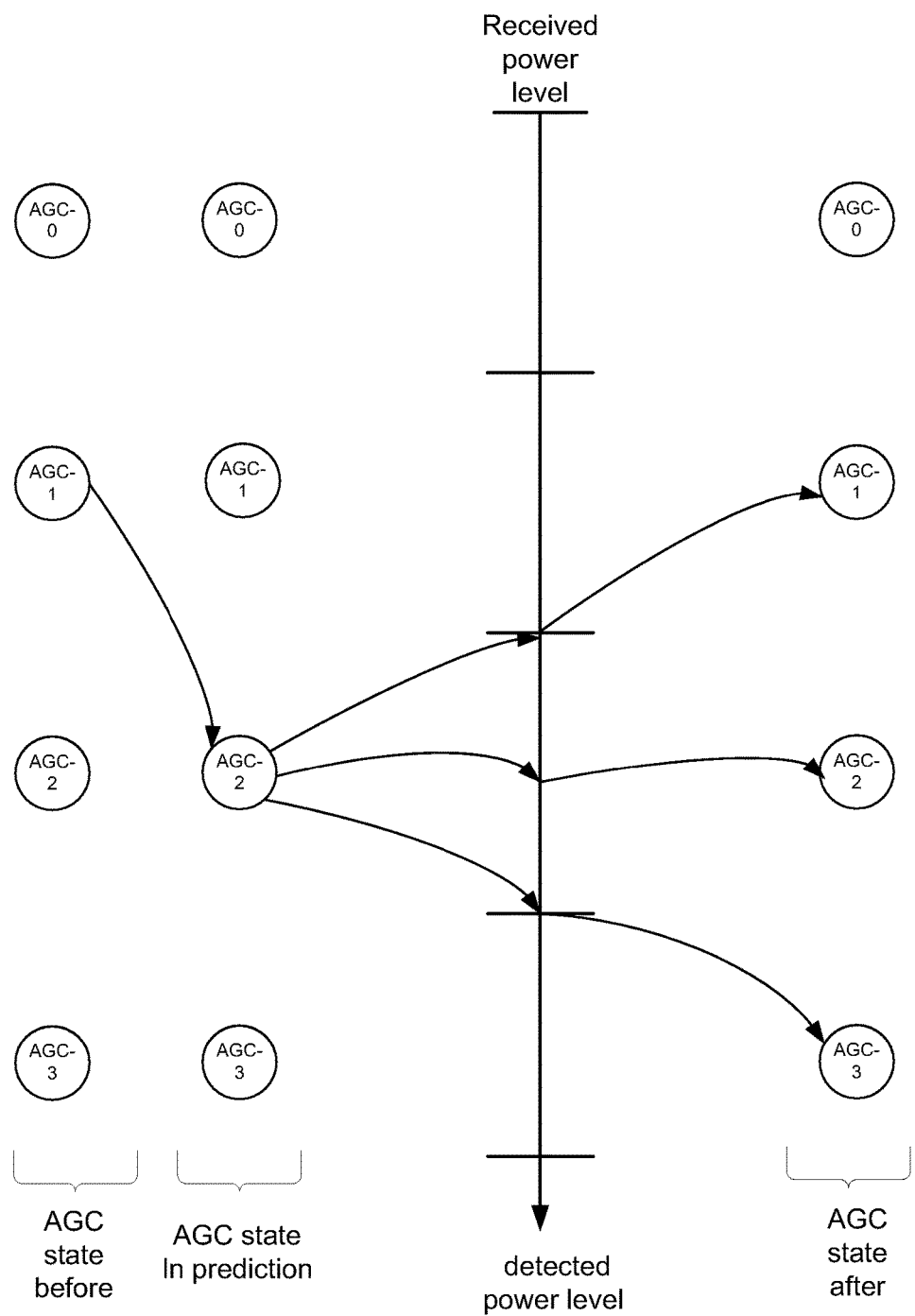
FIG. 15 is a schematic illustration of AGC setting transitions under the pattern of the high interference possibility according to an embodiment of the present invention.

FIG. 15 is a schematic illustration of AGC setting transitions under the pattern of the high interference possibility according to an embodiment of the present invention. As illustrated in FIG. 15, before the prediction operation, the AGC setting could be increased one step manually, resulting in an AGC-1. Due to the pattern of the high interference possibility, the AGC-1 will be adjusted to AGC-2 as a result of the prediction so as to decrease the receiver gain. After the prediction, similar to those discussed with reference to FIG. 13, based on the comparing of the detected power level with the predefined upper limit threshold and the predefined low limit threshold, the predicted AGC-2 may be adjusted to AGC-1 due to low interference, retain unchanged AGC-2 due to medium interference, and adjusted to AGC-3 due to high interference.

It should be noted that the increase of the AGC settings (e.g., from AGC-0 to AGC-1 or from AGC-1 to AGC-2) would result in corresponding decrease of the receiver gain and likewise the decrease of the AGC settings (e.g., from AGC-1 to AGC-0 or from AGC-2 to AGC-1) would result in corresponding increase of the receiver gain.

Further, it can be seen from the above that the prediction and adjustment operations according to embodiments of the present invention can be set and performed automatically and dynamically based on e.g., real-time traffic via the AGC statistical data.

Figure 16A:
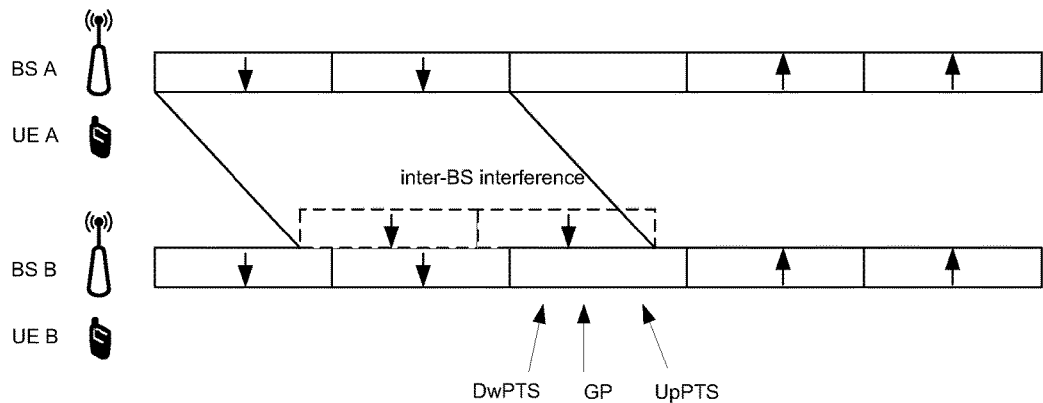
FIGS. 16a and 16b each illustrate a schematic illustration of a periodic interference scenario caused by inter-BS interference signals.
Figure 16B:
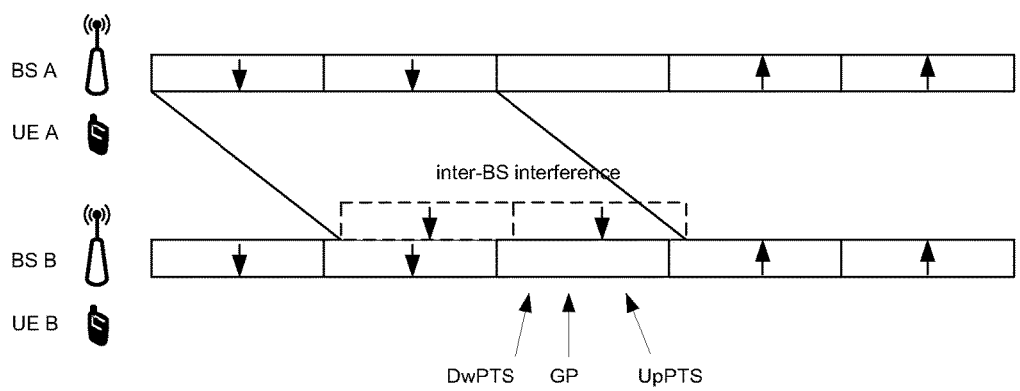

FIGS. 16a and 16b each illustrate a schematic illustration of a periodic interference scenario typically caused by inter-BS interference signals. In a TDD system, inter-BS interference is a very critical main cause of the periodic interference. Due to non-zero time delay, even a synchronized network may generate interference due to DL propagation time over a certain distance. As shown in the drawing, BS A's DL communication interferes with a portion of BS B's UL communication, assuming that the BS A communicates with the UE A and the BS B communicates with the UE B.

There would be two possible situations based on the distance difference between the BS A and BS B.

Situation 1: BS A' interference only impacts the special subframe of BS B and the AGC setting in the normal UL subframes should not be influenced, as illustrated in FIG. 16a.

Situation 2: BS A' interference impacts the UL subframe of the BS B and the AGC setting in the normal UL subframes should be adjusted, as illustrated in FIG. 16b.

Because the interference conditions in the GP and the subsequent UL subframe are the same in the situation 2, the AGC setting predicting and adjusting according to aspects and embodiments of the present invention can be well applicable to the situation 2. The following focuses on situation 1 with reference to FIG. 17.

The situation 1 can impact the efficiency of the adjusted AGC setting as discussed above since the detected power level of the interference in the GP is always higher than the interference power level in normal UL subframes.

Although the above interference pattern will cause misleading of AGC setting, the proactive AGC approach as proposed by the present invention still can distinguish the periodic interference from the instant interference and keep suitable receiver gain in the UL subframe with the pattern directed to the periodic interference.

In particular, if the detected power level in the GP is always higher than the detected power level in the UL subframes within a certain amount of time, the receiver according to embodiments of the present invention will decrease the prediction authority and even neglect the prediction result based on the pattern determined on multiple AGC settings. In other words, only the normal AGC is predominant and the receiver gain will be kept constant between adjacent UL subframes.

Figure 17:
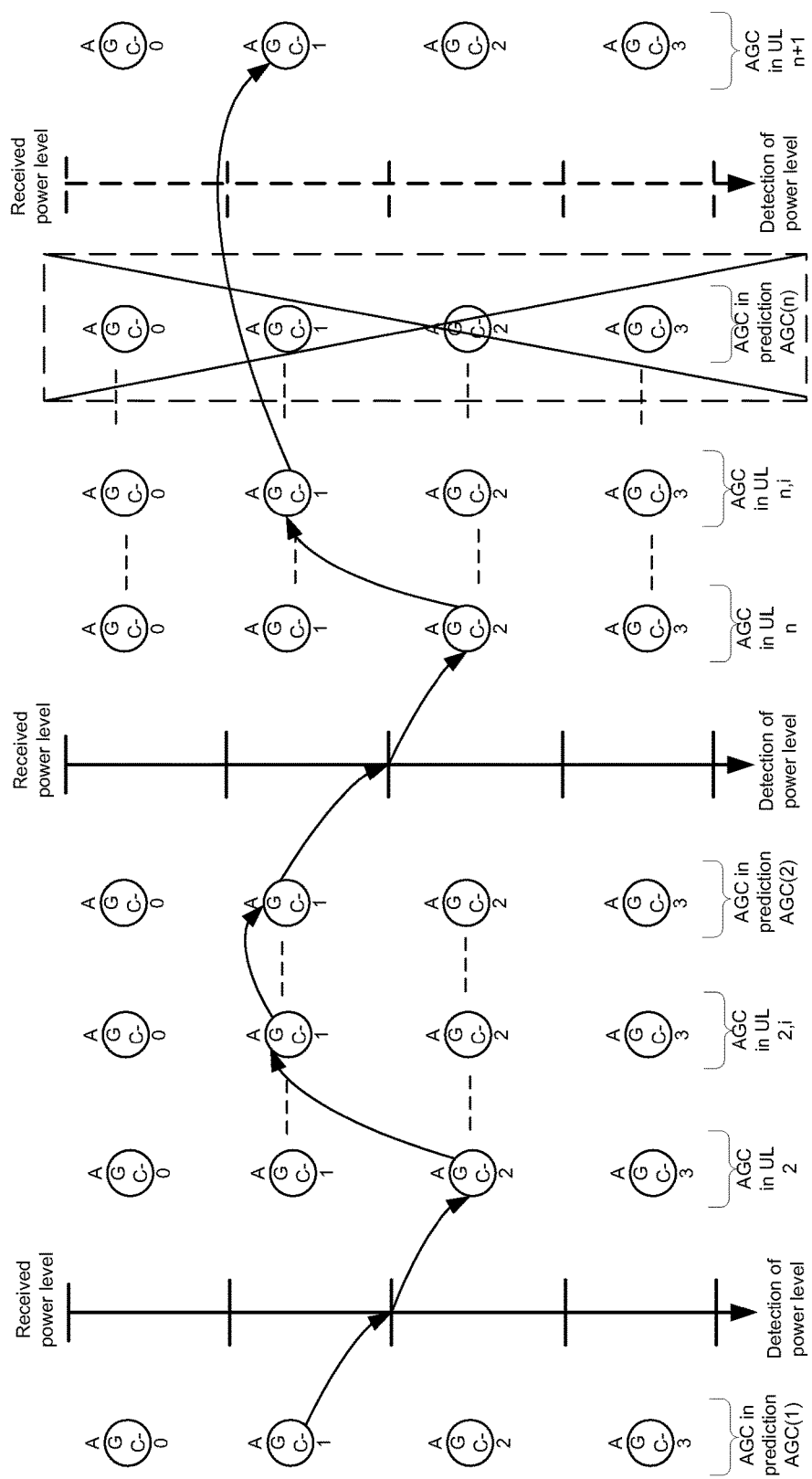

As illustrated in FIG. 17, after n AGC detection cycles, predicted AGC settings AGC(1) to AGC(n) in the GP are always higher than the real interference in the UL subframes, e.g., it may trigger higher AGC settings in the UL 2 until UL n. However, in the normal continuous UL subframes, AGC settings in UL subframes, e.g., AGC setting in UL 2,i and AGC setting in UL n,i will be decreased (where i is the number of continuous UL subframes) since there is no inter-BS interference falling into the UL subframes. In view of this, in the $n_{th}$ GP period, the AGC detection in the GP is neglected and the AGC setting in the UL n+1 is inherited from the AGC setting in UL n,i, where n could be defined in the pattern. It can be understood that the prediction of the AGC setting according to the embodiments of the present invention may be disabled in the inter-BS periodic interference scenario where necessary and may be enabled once such inter-BS periodic interference is eliminated. In other words, if the periodic interference only occurs during the detection period (e.g., during the GP), the prediction of the AGC setting according to the embodiments of the present invention can be tentatively disabled or the prediction is still enabled but the subsequent adjustment and application of the predicted result could be bypassed, depending on the different implementations.

Figure 18:
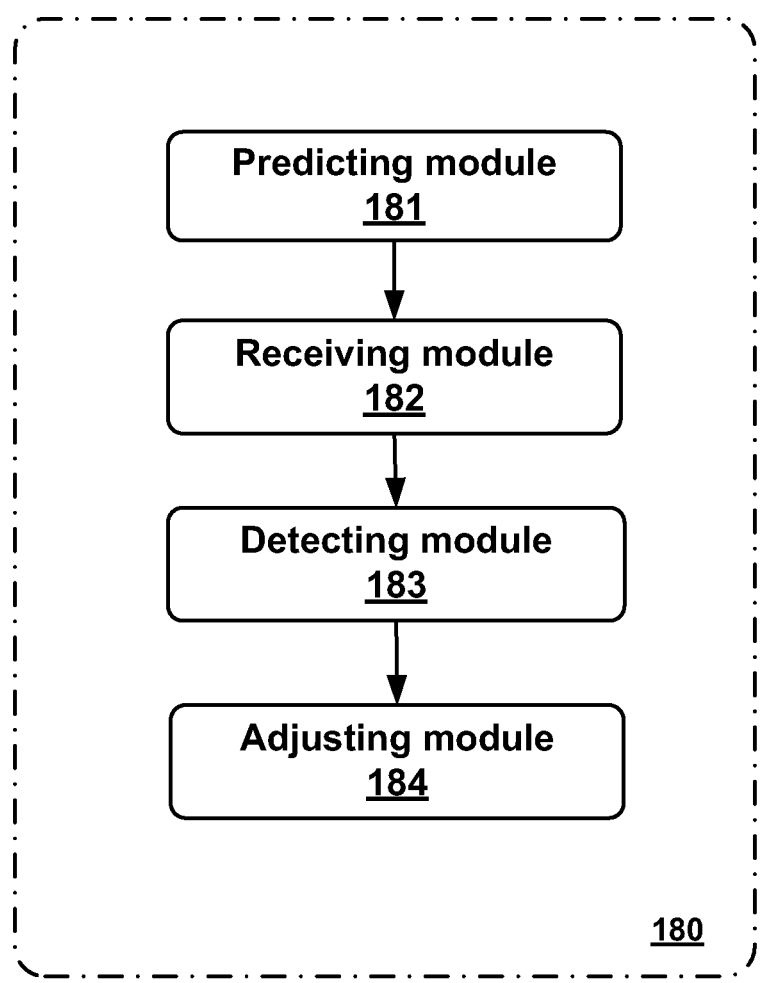
FIG. 18 is a schematic block diagram of a device for performing AGC according to embodiments of the present invention.

FIG. 18 is a schematic block diagram of a device 180 for performing AGC according to embodiments of the present invention. As illustrated in FIG. 18, the device 180 comprises a predicting module 181 configured to predict an AGC setting to be used based on statistical data with respect to a plurality of previously stored AGC settings. The device 180 also comprises a receiving module 182 configured to receive an interference signal during an idle time period using the predicted AGC setting. The device 180 further comprises a detecting module 183 configured to detect received power of the interference signal. The device 180 additionally comprises an adjusting module 184 configured to adjust the predicted AGC setting based on a result of the detecting.

According to an embodiment of the present invention, the statistical data is used to determine one of a trend and an average value of the plurality of previously stored AGC settings, and the predicting module 181 is configured to predict the AGC setting based on the trend or the average value.

According to another embodiment of the present invention, the trend is an increasing trend, a decreasing trend or an uncertain trend, and the predicting module 181 is configured to increase, decrease or retain unchanged an AGC setting used immediately before the predicting based on the increasing trend, the decreasing trend or the uncertain trend, respectively.

According to a further embodiment of the present invention, wherein the predicting module 181 is configured to predict the AGC setting based on a result of comparing the average value with at least two predefined thresholds, wherein one of the at least two predefined threshold is an upper limit threshold and another one of the at least two predefined thresholds is a lower limit threshold.

According to an additional embodiment of the present invention, the adjusting module 184 is configured to adjust the predicted AGC setting based on a result of comparing the received power of the interference signal with at least two predefined thresholds, wherein one of the at least two predefined threshold is an upper limit threshold and another one of the at least two predefined thresholds is a lower limit threshold.

According to yet another embodiment of the present invention, the adjusting module 184 is configured to increase, decrease or retain unchanged the predicted AGC setting based on the received power being higher than the upper limit threshold, the received power being lower than the lower limit threshold, or the received power falling between the upper limit threshold and the lower limit threshold, respectively.

The device 180 as discussed above may also be a BS or a UE capable of performing, among other things, AGC according to the embodiments of the present invention. Further, the device 180 may be a TDD receiver and the idle time period is a GP in a special subframe. Thereby, it is to be appreciated by those skilled in the art that the device 180 is illustrated in a more general manner in FIG. 18 and the receiver as shown in FIG. 11 could be one possible specific implementation thereof. For example, the predicting module 181 could be specifically embodied as the AGC prediction block in FIG. 11. Similarly, the comparing block in FIG. 11 could be a constituent part of the detecting module 183 in FIG. 18. Furthermore, the TDD system is introduced and discussed in the present invention as one of possible applicable wireless systems and those skilled in the art can understand that the present invention should not be limited to this specific form and a wireless system in which discontinuous transmissions do exist could take advantage of the present invention.

The techniques described herein may be implemented by various means so that an device implementing one or more functions of a corresponding mobile entity described with an embodiment comprises not only prior art means, but also means for implementing the one or more functions of a corresponding apparatus described with an embodiment and it may comprise separate means for each separate function, or means may be configured to perform two or more functions. For example, these techniques may be implemented in hardware (one or more apparatuses), firmware (one or more apparatuses), software (one or more modules), or combinations thereof. For a firmware or software, implementation can be through modules (e.g., procedures, functions, and so on) that perform the functions described herein.

Many modifications and other embodiments of the inventions set forth herein will come to mind to one skilled in the art to which these embodiments of the invention pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A method for performing Automatic Gain Control, AGC, in a receiver in a wireless communication system, comprising:
    predicting an AGC setting to be used based on statistical data with respect to a plurality of previously stored AGC settings;
    receiving an interference signal during an idle time period using the predicted AGC setting;
    detecting received power of the interference signal; and
    adjusting the predicted AGC setting based on a result of the detecting.

2. The method according to claim 1, wherein the statistical data is used to determine one of a trend and an average value of the plurality of previously stored AGC settings and the AGC setting is predicted based on the trend or the average value.

3. The method according to claim 2, wherein the trend is an increasing trend, a decreasing trend or an uncertain trend, and the AGC setting being predicted based on the trend comprises:
    increasing, decreasing or retaining unchanged an AGC setting used immediately before the predicting based on the increasing trend, the decreasing trend or the uncertain trend, respectively.

4. The method according to claim 2, wherein the AGC setting is predicted based on a result of comparing the average value with at least two predefined thresholds, one of the at least two predefined threshold being an upper limit threshold and another one of the at least two predefined thresholds being a lower limit threshold.

5. The method according to claim 4, wherein the AGC setting being predicted based on the result of comparing comprises:
    increasing, decreasing or retaining unchanged an AGC setting used immediately before the predicting based on the average value being higher than the upper limit threshold, the average value being lower than the lower limit threshold or the average value falling between the upper limit threshold and the lower limit threshold, respectively.

6. The method according to claim 1, wherein adjusting the predicted AGC setting based on the result of the detecting comprises:
    adjusting the predicted AGC setting based on a result of comparing the received power of the interference signal with at least two predefined thresholds, wherein one of the at least two predefined threshold is an upper limit threshold and another one of the at least two predefined thresholds is a lower limit threshold.

7. The method according to claim 6, wherein adjusting the predicted AGC setting based on the result of the comparing comprises:
    increasing, decreasing or retaining unchanged the predicted AGC setting based on the received power being higher than the upper limit threshold, the received power being lower than the lower limit threshold, or the received power falling between the upper limit threshold and the lower limit threshold, respectively.

8. The method according to claim 1, wherein the receiver is a time division duplex, TDD, receiver and the idle time period is a guard period in a special subframe.

* * * * *